United States Patent
Ichiyama et al.

(10) Patent No.: US 8,014,465 B2
(45) Date of Patent: Sep. 6, 2011

(54) DIGITAL MODULATOR, DIGITAL MODULATING METHOD, DIGITAL TRANSCEIVER SYSTEM, AND TESTING APPARATUS

(75) Inventors: Kiyotaka Ichiyama, Tokyo (JP); Masahiro Ishida, Tokyo (JP); Takahiro Yamaguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 636 days.

(21) Appl. No.: 12/136,048

(22) Filed: Jun. 10, 2008

(65) Prior Publication Data

US 2009/0304053 A1  Dec. 10, 2009

(51) Int. Cl.
*H04L 27/00* (2006.01)

(52) U.S. Cl. ........ 375/295; 375/219; 375/224; 375/226; 375/296; 375/303; 332/103; 332/104

(58) Field of Classification Search .............. 375/295, 375/219, 224, 226, 296, 303; 332/103, 104
See application file for complete search history.

(56) References Cited

U.S. PATENT DOCUMENTS

| | | | | |
|---|---|---|---|---|
| 3,636,477 A | * | 1/1972 | Selz | 332/100 |
| 4,041,533 A | * | 8/1977 | Yamamoto et al. | 348/536 |
| 4,907,092 A | * | 3/1990 | Iwase et al. | 386/201 |
| 6,160,856 A | * | 12/2000 | Gershon | 375/320 |
| 6,909,316 B2 | * | 6/2005 | Owens et al. | 327/266 |
| 2003/0041294 A1 | * | 2/2003 | Moll et al. | 714/709 |
| 2003/0058036 A1 | * | 3/2003 | Stillman et al. | 329/304 |
| 2003/0058959 A1 | * | 3/2003 | Rafie et al. | 375/296 |
| 2005/0271131 A1 | * | 12/2005 | Hafed et al. | 375/224 |
| 2007/0223938 A1 | * | 9/2007 | Gervais et al. | 398/188 |
| 2007/0247181 A1 | * | 10/2007 | Ishida et al. | 324/765 |
| 2008/0151981 A1 | * | 6/2008 | Ichiyama et al. | 375/226 |
| 2009/0207941 A1 | * | 8/2009 | Osman et al. | 375/302 |

FOREIGN PATENT DOCUMENTS

JP  2004274243  9/2004

* cited by examiner

*Primary Examiner* — Kenneth Lam
(74) *Attorney, Agent, or Firm* — Jianq Chyun IP Office

(57) ABSTRACT

Provided is a digital modulator, including a carrier wave output section that outputs a carrier wave, a variable delay section that delays the carrier wave, and a delay amount setting section that sets a delay amount by which the variable delay section delays the carrier wave based on transmission data being transmitted by the carrier wave. The variable delay section may include a multi-stage delay buffer circuit in which delay buffers that delay an input signal by a unit shift amount are connected in a cascade connection, the multi-stage delay buffer circuit may receive the carrier wave at a first-stage delay buffer as input, and the delay amount setting section may include a multiplexer that selects either an output from the carrier wave output section or an output from each stage of the multi-stage delay buffer circuit.

24 Claims, 14 Drawing Sheets

DIGITAL MODULATOR, DIGITAL MODULATING METHOD, DIGITAL TRANSCEIVER SYSTEM, AND TESTING APPARATUS

BACKGROUND

1. Technical Field

The present invention relates to a digital modulator, a digital modulation method, a digital transceiver system, and a test apparatus. In particular, the present invention relates to a digital modulator, a digital modulation method, a digital transceiver system, and a test apparatus suitable for integration and restricting power consumption.

2. Related Art

An IQ modulator is often used for digital modulation, as shown in Japanese Patent Application Publication No. 2004-274243. The IQ modulator includes an oscillator and two multipliers that output a carrier wave, a phase shifter that shifts the phase of the input signal by 90 degrees and outputs the thus shifted signal, and an adder.

Patent Documents cited: Japanese Patent Application Publication No. 2004-274243.

However, since the digital modulator is realized through an analog circuit, the implementation area and the power consumption become undesirably large.

SUMMARY

Therefore, it is an object of an aspect of the innovations herein to provide a digital modulator, a digital modulation method, a digital transceiver system, and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary digital modulator includes a carrier wave output section that outputs a carrier wave, a variable delay section that delays the carrier wave, and a delay amount setting section that sets a delay amount by which the variable delay section delays the carrier wave based on transmission data being transmitted by the carrier wave.

The variable delay section may include a multi-stage delay buffer circuit in which delay buffers that delay an input signal by a unit shift amount are connected in a cascade connection, the multi-stage delay buffer circuit may receive the carrier wave at a first-stage delay buffer as input, and the delay amount setting section may include a multiplexer that selects either an output from the carrier wave output section or an output from each stage of the multi-stage delay buffer circuit, based on the transmission data.

The multi-stage delay buffer circuit may includes M−1 stages of delay buffers in the cascade connection, and each delay buffer may delay the input signal by an amount obtained by dividing a cycle of the carrier wave by M.

The delay amount setting section may further include an exclusive OR gate that receives two inputs, one input being a value of a 1-bit portion of N-bit transmission data for setting the delay amount, and the other input being the output of the multiplexer, and the multiplexer may select the output according to a value of N−1 bits obtained by removing the 1-bit portion from the N-bit transmission data.

The multi-stage delay buffer circuit may includes $2^{N-1}-1$ stages of delay buffers in the cascade connection, and each delay buffer may delay the input signal by an amount obtained by dividing a cycle of the carrier wave by $2^N$.

The variable delay section may include a multi-stage delay buffer circuit including a plurality of delay sections connected in a cascade connection, each delay section may include a delay buffer that delays an input signal by any amount that is less than or equal to a cycle of the carrier wave and a bypass circuit that bypasses the delay buffer, the multi-stage delay buffer circuit may receive the carrier wave at a first-stage delay section as input, and the delay amount setting section may set a delay amount of the carrier wave by selecting either the delay buffer or the bypass circuit in each delay section, based on the transmission data being transmitted.

The multi-stage delay buffer circuit may include L stages of delay sections in the cascade connection, and the delay buffers in the delay sections at the L stages may delay the input signal by a period obtained by dividing the cycle of the carrier wave by $2^1, 2^2, 2^3, \ldots, 2^L$, respectively.

The multi-stage delay buffer circuit may include L−1 stages of delay sections in the cascade connection; the delay buffers in the delay sections at the L−1 stages may delay the input signal by a period obtained by dividing the cycle of the carrier wave by $2^2, 2^3, \ldots, 2^L$, respectively; the delay amount setting section may further include an exclusive OR gate that receives two inputs, one input being a value of a 1-bit portion of N-bit transmission data for selecting the delay amount, and the other input being the output of the multi-stage delay buffer circuit; and the delay amount setting section may set the delay amount of the carrier wave by selecting either the delay buffer or the bypass circuit in each delay section, based on a value of N−1 bits obtained by removing the 1-bit portion from the N-bit transmission data.

The digital modulator may further include a delay lock loop that includes a phase difference output section that receives the carrier wave output by the carrier wave output section and a delayed wave having the same phase as the carrier wave via the variable delay section, and outputs a voltage according to a phase difference between the carrier wave and the delayed wave. The delay lock loop may supply the voltage output by the phase difference output section to the delay buffers in the variable delay section to reset the delay amount of the carrier wave delayed by the variable delay section.

The digital modulator may further include an amplitude modulating section that modulates amplitude of the carrier wave delayed by the variable delay section according to the transmission data.

The digital modulator may further include an encoder that encodes the transmission data with delay control data for controlling the delay amount set by the delay amount setting section and amplitude control data for controlling the amplitude modulated by the amplitude modulating section. The delay amount setting section may set the delay amount of the carrier wave based on the delay control data encoded by the encoder and the amplitude modulating section may modulate the amplitude of the carrier wave based on the amplitude control data encoded by the encoder.

According to a second aspect related to the innovations herein, one exemplary digital modulation method may include the steps of outputting a carrier wave, delaying the carrier wave, and setting an amount by which the carrier wave is delayed at the delaying step based on transmission data being transmitted by the carrier wave.

According to a third aspect related to the innovations herein, one exemplary digital transceiver system may include a digital modulator and a demodulator. The digital modulator may include a carrier wave output section that outputs a carrier wave, a variable delay section that delays the carrier wave output by the carrier wave output section, and a delay amount setting section that sets a delay amount by which the variable delay section delays the carrier wave based on transmission data being transmitted by the carrier wave. The demodulator may include a reference wave output section that outputs a reference wave identical to the carrier wave, a phase detecting section that outputs a voltage corresponding to a phase difference between the delayed carrier wave and the reference wave, and an analog-to-digital converter that converts the voltage output by the phase detecting section into the transmission data.

According to a fourth aspect related to the innovations herein, one exemplary test apparatus may include a digital modulator having a carrier wave output section that outputs a carrier wave, a variable delay section that delays the carrier wave, and a delay amount setting section that sets a delay amount by which the variable delay section delays the carrier wave based on transmission data being transmitted by the carrier wave. The test apparatus may test a device under test by supplying the device under test with a modulated signal output by the digital modulator.

The test apparatus may further include a variable phase section that modulates a timing of a test signal supplied to the device under test, and the variable delay section of the digital modulator may uses variable phase section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
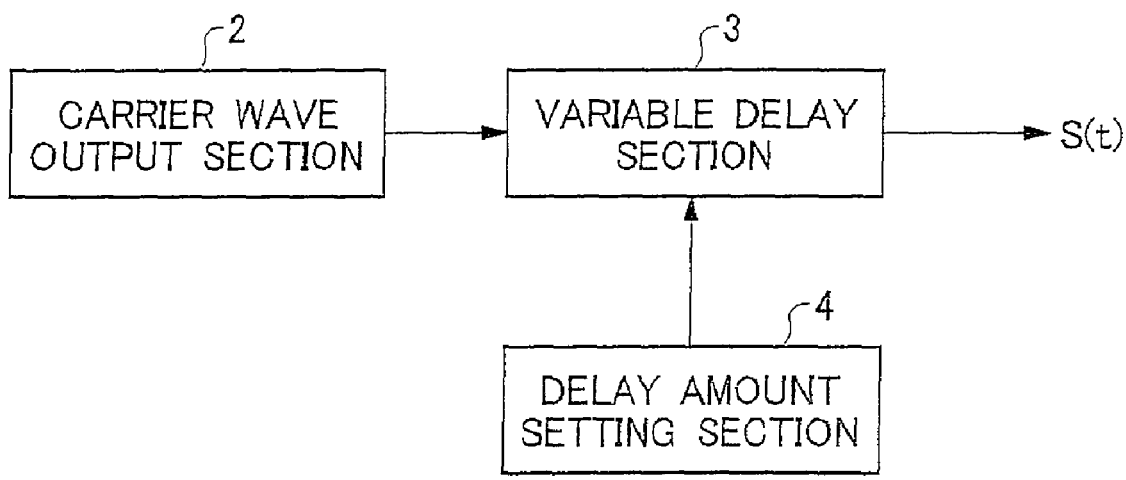
FIG. 1 shows an exemplary configuration of a digital modulator 1 according to the present embodiment.

FIG. 1 shows an exemplary configuration of a digital modulator 1 according to the present embodiment. The digital modulator 1 is provided with a carrier wave output section 2, a variable delay section 3, and a delay amount setting section 4.

The carrier wave output section 2 outputs a carrier wave. For example, the carrier wave output section 2 is an oscillator that outputs a clock signal. The carrier wave output section 2 outputs the carrier wave to the variable delay section 3.

The variable delay section 3 delays the phase of the input carrier wave by a delay amount set by the delay amount setting section 4. The variable delay section 3 outputs the thus delayed carrier wave as an IQ wave S(t).

The delay amount setting section 4 sets the delay amount according to the data to be transmitted. This transmission data may be a digital signal or the like.

Figure 2:
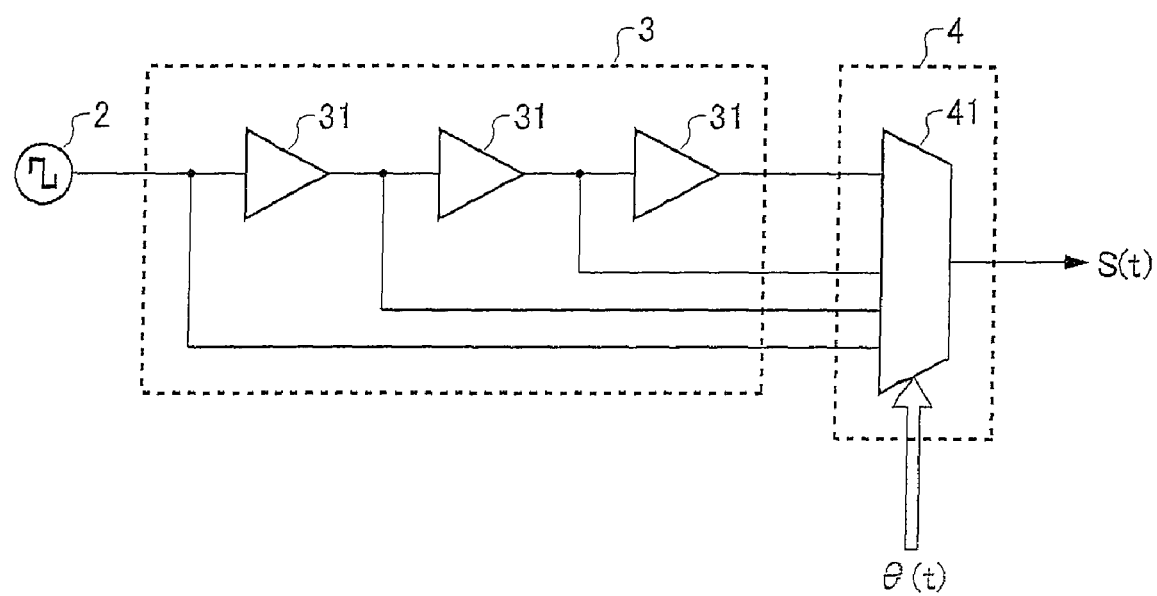
FIG. 2 shows an exemplary digital circuit describing a detailed configuration of the digital modulator 1.

FIG. 2 shows an exemplary digital circuit describing a detailed configuration of the digital modulator 1. FIG. 2 represents a digital circuit that is an M-PSK modulator.

The variable delay section 3 of FIG. 2 has a multi-stage delay buffer circuit, in which a plurality of delay buffers 31 are cascaded to delay the input carrier wave by a unit shift amount. The delay time of each delay buffer 31 in the cascade connection is equal to the cycle T/M of the carrier wave. The number of stages of delay buffers in the cascade connection is equal to M−1.

Here, M is determined by the number of bits of the digital signal being transmitted. For example, if a 2-bit data signal is being transferred, there are four digital values 00, 01, 10, and 11, and therefore M is equal to 4. If a 3-bit signal is being transmitted, there are eight digital values 000, 001, 010, 011, 100, 101, 110, and 111, and therefore M is equal to 8. In the examples shown above, M is equal to a power of 2.

It should be noted that M is not necessarily equal to a power of 2, and may be any value as long as M is determined by the number of digital values being transmitted. For example, if five digital values 000, 001, 010, 011, and 100 are being transmitted, M is equal to 5.

The carrier wave output section 2 outputs the carrier wave to the delay buffer 31 at the first stage of the multi-stage delay buffer circuit. The first-stage delay buffer 31 delays the input carrier wave by a unit shift amount. The first-stage delay buffer 31 outputs the thus delayed carrier wave to the delay buffer 31 at the subsequent stage. The delay buffer at each stage delays the carrier wave in this way. The multi-stage delay buffer circuit outputs, to the delay amount setting section 4, the carrier wave that is output from the carrier wave output section 2 and the carrier waves that are delayed by the delay buffers 31 at each stage.

FIG. 2 shows an example where M=4. Accordingly, three delay buffers 31 are included in the cascade connection. The delay amount of each delay buffer 31 is equal to T/4, which is $\pi/2$. One stage of delay buffers 31 delays the phase of the carrier wave by $\pi/2$. Two stages of delay buffers 31 delay the phase by $\pi$. Three stages of delay buffers 31 delay the phase by $3\pi/2$.

The delay amount setting section 4 of FIG. 2 includes a multiplexer 41. The multiplexer 41 outputs the input carrier wave corresponding to $\theta(t)$ as the IQ wave S(t), from among the carrier waves of various phases input into the multiplexer 41. In other words, the multiplexer 41 designates the carrier wave that is output from the multi-stage delay buffer circuit as the IQ wave S(t).

Here, θ(t) represents a signal input into the multiplexer 41. The value of θ(t) input into the multiplexer in FIG. 2 represents the digital values being transmitted. In other words, the multiplexer 41 outputs as the IQ wave S(t) the carrier wave having a phase that corresponds to the digital value being transmitted. At this time, each digital value being transmitted, such as 00, 01, 10, and 11, may be associated with a phase delayed by the multi-stage delay buffer circuit. In other words, the digital values may be allocated to the phases.

Figure 3:
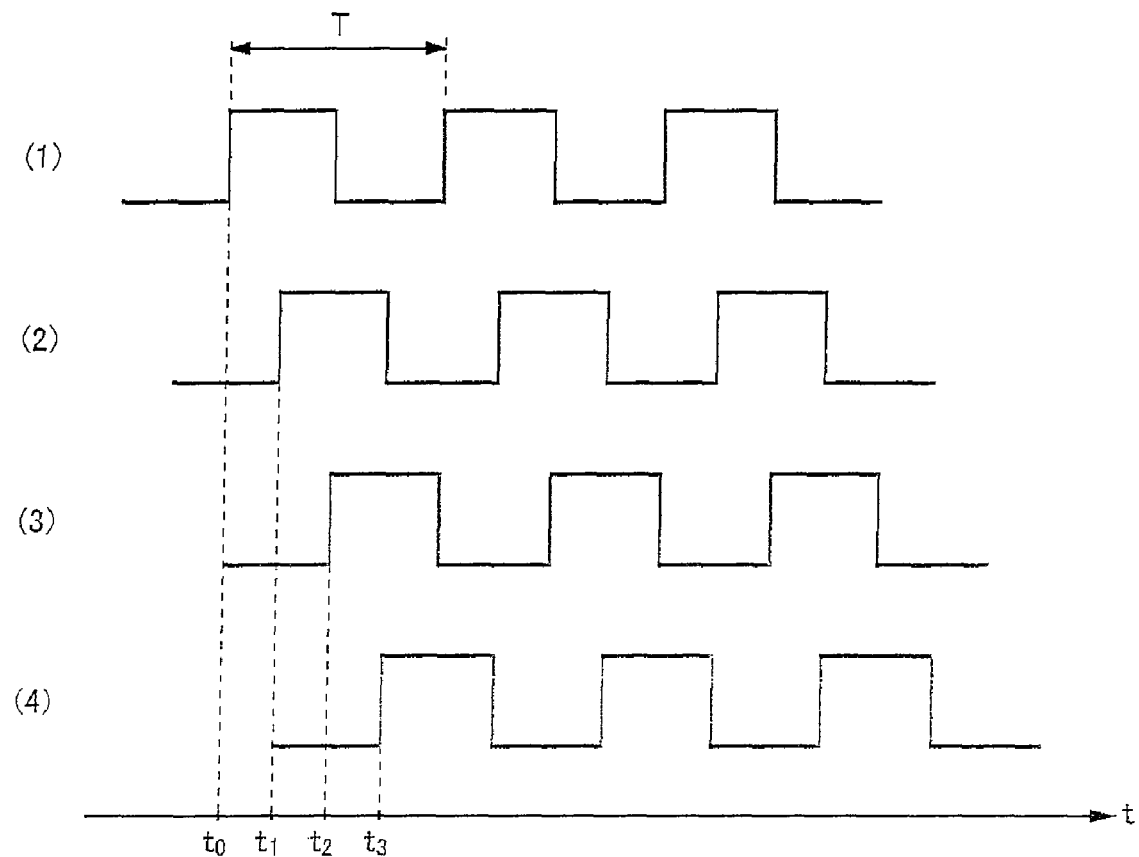
FIG. 3 shows the timing of each carrier wave input into the multiplexer 41 through the multi-stage delay buffer circuit.

FIG. 3 shows the timing of each carrier wave input into the multiplexer 41 through the multi-stage delay buffer circuit shown in FIG. 2. In FIG. 3, (1) represents the carrier wave input directly into the multiplexer 41 without being delayed by the delay buffers 31 in the multi-stage delay buffer circuit. In other words, the carrier wave represented by (1) is output by the carrier wave output section 2. In FIG. 3, (2) represents the carrier wave that is output to the multiplexer 41 after being delayed by the first-stage delay buffer 31.

In FIG. 3, (3) represents the carrier wave that is output to the multiplexer 41 after being delayed by two stages of delay buffers 31, and (4) represents the carrier wave that is output to the multiplexer 41 after being delayed by three stages of delay buffers 31.

In FIG. 3, the phase of the carrier wave (2) is delayed by $t_1-t_0$, which is equal to T/4, in relation to the phase of the carrier wave (1). The phase of the carrier wave (3) is delayed by $t_2-t_0$, which is equal to 2T/4, in relation to the phase of the carrier wave (1). The phase of the carrier wave (4) is delayed by $t_3-t_0$, which is equal to 3T/4, in relation to the phase of the carrier wave (1).

The multiplexer 41 designates the carrier wave having a phase corresponding to the digital value being transmitted to be the IQ wave S(t), and outputs this IQ wave S(t). For example, if the phase T/4 corresponds to the digital value 01 and θ(t) is 01, the multiplexer 41 outputs, as the IQ wave S(t), the carrier wave delayed by T/4, which is equal to π/2, as shown by (2) in FIG. 3. If the phase 2T/4 corresponds to the digital value 10 and θ(t) is 10, the multiplexer 41 outputs, as the IQ wave S(t), the carrier wave delayed by 2T/4, which is equal to π, as shown by (3) in FIG. 3. In this way, the digital modulator 1 can modulate the phase of the carrier wave output by the carrier wave output section 2 to correspond to the digital value being transmitted.

Figure 4:
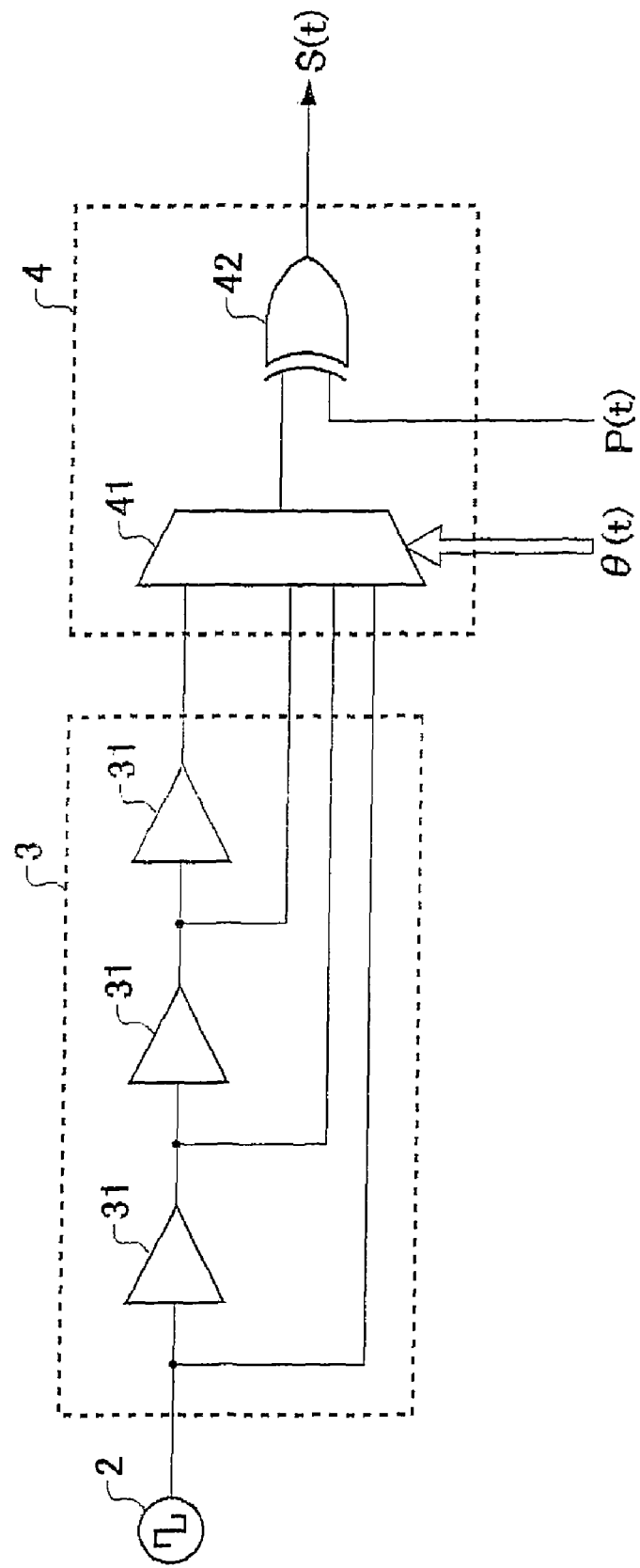
FIG. 4 shows another exemplary digital circuit describing a detailed configuration of the digital modulator 1.

FIG. 4 shows another exemplary digital circuit describing a detailed configuration of the digital modulator 1. FIG. 4 represents a digital circuit that is an M-PSK modulator, where M=8. Configurations in FIG. 4 that are identical to those of FIG. 2 are given the same reference numerals, and only differing points will be described.

The delay amount, also known as the delay time, of each variable delay buffer 31 in the cascade connection of the multi-stage delay buffer circuit shown in FIG. 4 is equal to T/M, where T is the cycle of the carrier wave. The number of stages of delay buffers 31 in the cascade connection is equal to M/2−1.

FIG. 4 shows an example in which M=8. Accordingly, there are three delay buffers 31 in the cascade connection. The delay amount of each delay buffer 31 is T/8. Therefore, the first-stage delay buffer delays the phase by π/4, two stages of delay buffers delay the phase by 2π/4, and three stages of delay buffers delay the phase by 3π/4.

If an exclusive OR gate 42 is provided, as described hereinafter, an excess phase remains if M is not equal to a power of 2, which means that a carrier wave having a phase that is not allocated to a digital value will be output. Accordingly, M is desirably equal to a power of 2 if the exclusive OR gate 42 is provided.

The delay amount setting section 4 of FIG. 4 includes the exclusive OR gate 42 in addition to the multiplexer 41. The multiplexer 41 outputs the carrier wave having the phase corresponding to the value of the input θ(t), as described above. The carrier wave output by the multiplexer 41 is input into the exclusive OR gate 42. At this time, each value of θ(t) can be associated with a phase obtained through the delay by the multi-stage delay buffer circuit.

Depending on the input P(t), the exclusive OR gate 42 either (i) outputs the input carrier wave without alteration as the IQ wave S(t) or (ii) inverts the input carrier wave, which is equivalent to delaying the phase of the input carrier wave by π, and outputs the thus inverted carrier wave as the IQ wave S(t). Here, if the input P(t) is equal to 0, the exclusive OR gate 42 outputs the input carrier wave as the IQ wave S(t). If the input P(t) is equal to 1, the exclusive OR gate 42 outputs the inverted input carrier wave as the IQ wave S(t).

The value θ(t) input into the multiplexer of FIG. 4 has one bit removed from the digital value being transmitted. The value P(t) input into the exclusive OR gate is one bit of the digital value being transmitted. For example, if the digital value being transmitted is 011, θ(t) is equal to 11 and P(t) is equal to 0. If the digital value being transmitted is 100, θ(t) is equal to 00 and P(t) is equal to 1. As shown, P(t) is the first digit of the digital value being transmitted and θ(t) is all of the digits except the first digit.

Figure 5:
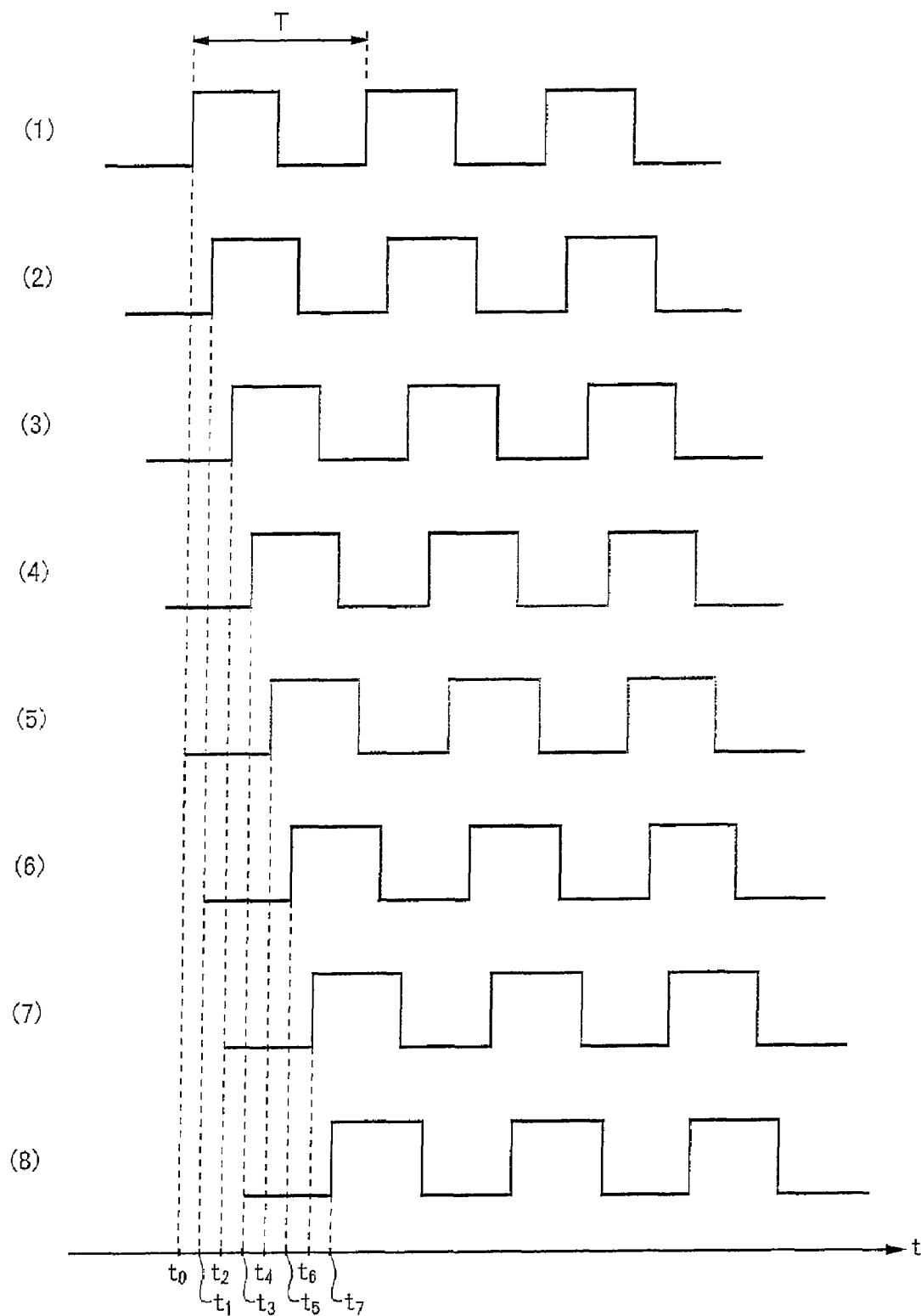
FIG. 5 shows the timing of carrier waves output as the IQ wave S(t).

FIG. 5 shows the timing of the carrier waves that can be output as the IQ wave S(t). In FIG. 5, the phase of the carrier wave (2) is delayed by $t_1-t_0$, which is equal to T/8, in relation to the phase of the carrier wave (1). The phase of the carrier wave (3) is delayed by $t_2-t_0$, which is equal to 2T/8, in relation to the phase of the carrier wave (1). The phase of the carrier wave (4) is delayed by $t_3-t_0$, which is equal to 3T/8, in relation to the phase of the carrier wave (1).

Furthermore, the carrier wave (5) is the inverse of the carrier wave (1), the carrier wave (6) is the inverse of the carrier wave (2), the carrier wave (7) is the inverse of the carrier wave (3), and carrier wave (8) is the inverse of the carrier wave (4).

The carrier waves (1) to (4) in FIG. 5 represent the carrier waves input into the multiplexer 41 through the multi-stage delay buffer circuit. If the phase 0 is set to correspond to the digital value 00 and the digital value being transmitted is 000 or 100, θ(t) is equal to 00, and therefore the multiplexer 41 outputs the carrier wave (1) without delaying the phase. If the digital value being transmitted is 000, P(t) is equal to 0, and therefore the exclusive OR gate 42 outputs the unaltered carrier wave (1) as the IQ wave S(t). On the other hand, if the digital value being transmitted is 100, P(t) is equal to 1, and therefore the exclusive OR gate 42 inverts the phase of the carrier wave (1) to obtain the carrier wave (5), and outputs this carrier wave (5) as the IQ wave S(t).

If the phase T/8 is set to correspond to the digital value 01 and the digital value being transmitted is 001 or 101, η(t) is equal to 01, and therefore the multiplexer 41 outputs the carrier wave (2) having a phase delayed by T/8. If the digital value being transmitted is 001, P(t) is equal to 0, and therefore the exclusive OR gate 42 outputs the carrier wave (2) as the IQ wave S(t). On the other hand, if the digital value being transmitted is 101, P(t) is equal to 1, and therefore the exclusive OR gate inverts the phase of the carrier wave (2) to obtain the carrier wave (6), and outputs this carrier wave (6) as the IQ wave S(t).

If the phase 2T/8 is set to correspond to the digital value 10 and the digital value being transmitted is 010 or 110, θ(t) is equal to 10, and therefore the multiplexer 41 outputs the carrier wave (3) having a phase delayed by 2T/8. If the digital value being transmitted is 010, P(t) is equal to 0, and therefore the exclusive OR gate 42 outputs the carrier wave (3) as the IQ wave S(t). On the other hand, if the digital value being transmitted is 110, P(t) is equal to 1, and therefore the exclusive OR gate inverts the phase of the carrier wave (3) to obtain the carrier wave (7), and outputs this carrier wave (7) as the IQ wave S(t).

If the phase 3T/8 is set to correspond to the digital value 11 and the digital value being transmitted is 011 or 111, θ(t) is equal to 11, and therefore the multiplexer 41 outputs the carrier wave (4) having a phase delayed by 3T/8. If the digital value being transmitted is 011, P(t) is equal to 0, and therefore the exclusive OR gate 42 outputs the carrier wave (4) as the IQ wave S(t). On the other hand, if the digital value being transmitted is 111, P(t) is equal to 1, and therefore the exclusive OR gate inverts the phase of the carrier wave (4) to obtain the carrier wave (8), and outputs this carrier wave (8) as the IQ wave S(t). In this way, the digital modulator 1 can modulate the phase of the carrier wave output by the carrier wave output section 2 to correspond to the digital value being transmitted.

Figure 6:
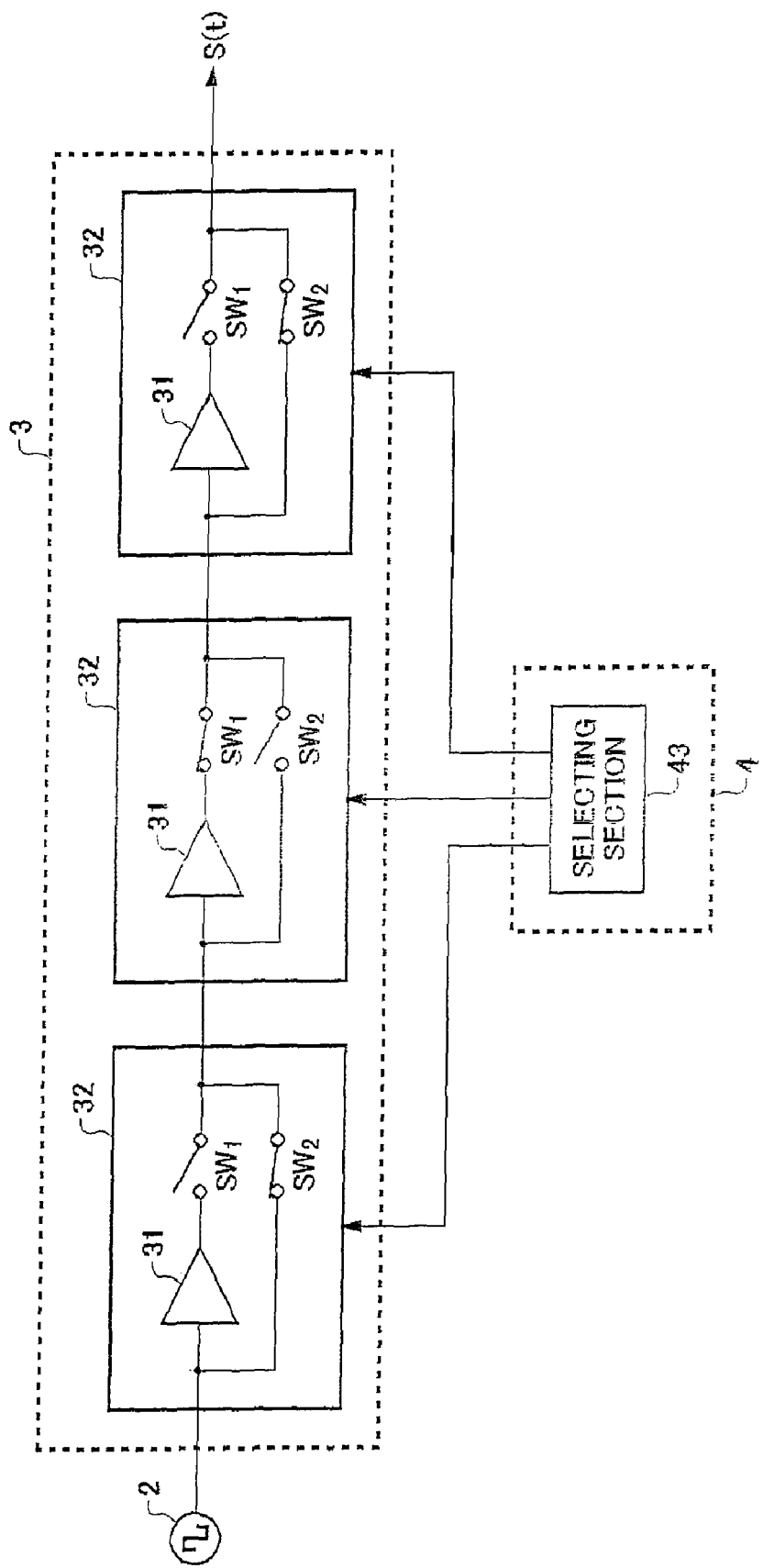
FIG. 6 shows another exemplary digital circuit describing a detailed configuration of the digital modulator 1.

FIG. 6 shows another exemplary digital circuit describing a detailed configuration of the digital modulator 1. FIG. 6 represents a digital circuit that is an M-PSK modulator, where M=8. Configurations in FIG. 6 that are identical to those of FIG. 2 are given the same reference numerals, and only differing points will be described. The variable delay section 3 shown in FIG. 6 includes a multi-stage delay buffer circuit in which a plurality of delay sections 32 are connected in a cascading manner, and each delay section 32 includes a delay buffer 31 and a bypass circuit for bypassing the delay buffer 31. Each delay buffer 31 delays an input signal by any amount that is less than or equal to the cycle of the carrier wave.

The delay amount of the delay buffer 31 in each delay section 32 is different for each delay section 32. If the number of stages of delay sections 32 in the cascade connection is set to L, the delay amount of the delay buffer 31 in the first-stage delay section 32 is equal to $T/2^1$, the delay amount of the delay buffer 31 in the second-stage delay section 32 is equal to $T/2^2$, ..., and the delay amount of the delay buffer 31 in the L-stage delay section 32 is equal $T/2^L$, where T is the cycle of the carrier wave.

Since there are three stages of delay sections 32 in FIG. 6, the delay amount of the delay buffer 31 in the first-stage delay section 32 is equal to $T/2^1$, which is T/2, the delay amount of the delay buffer 31 in the second-stage delay section 32 is equal to $T/2^2$, which is T/4, and the delay amount of the delay buffer 31 in the third-stage delay section 32 is equal to $T/2^3$, which is T/8.

The number of stages L of delay sections 32 in the cascade connection determines the number of bits in the digital signal being transmitted, so that the number of bits in the digital signal being transmitted is equal to L. For example, there are three stages in the cascade connection if a 3-bit digital signal is being transmitted and there are five stages in the cascade connection if a 5-bit signal is being transmitted.

Each delay section 32 includes a switch SW1 at an output end of the delay buffer 31 and a switch SW2 in the delay buffer 31 bypass circuit. When either one of the switch SW1 or the switch SW2 is turned on, the other is turned off. In this way, the delay section 32 can selectively output either the input carrier wave or the input carrier wave that is delayed by the delay buffer 31.

The delay amount setting section 4 shown in FIG. 6 includes a selecting section 43. The selecting section 43 sets the delay amount of the phase of the carrier wave output from the multi-stage delay buffer circuit by connecting or disconnecting the switches SW1 and SW2 in each delay section 32 according to the digital signal being transmitted. Here, in each delay section 32, the switch SW2 is turned on if the switch SW1 is turned off, and the switch SW2 is turned off if the switch SW1 is turned on. Furthermore, each phase delayed by the multi-stage delay buffer circuit is associated in advance with a digital value.

If the phase 3T/8 corresponds to the digital value 011 and the digital value being transmitted is 011, the phase of the carrier wave must be delayed by 3T/8. Accordingly, the selecting section 43 turns off the switch SW1 and turns on the switch SW2 in the first-stage delay section 32. The selecting section 43 turns on the switch SW1 and turns off the switch SW2 in each of the second-stage delay section 32 and the third-stage delay section 32. In this way, the multi-stage delay buffer circuit can output, as the IQ wave S(t), the carrier wave that is delayed by the delay buffer 31 in each of the second-stage delay section 32 and the third-stage delay section 32.

If the phase 6T/8 corresponds to the digital value 110 and the digital value being transmitted is 110, the phase of the carrier wave must be delayed by 6T/8. Accordingly, the selecting section 43 turns on the switch SW1 and turns off the switch SW2 in each of the first-stage delay section 32 and the second-stage delay section 32. The selecting section 43 turns off the switch SW1 and turns on the switch SW2 in the third-stage delay section 32. In this way, the multi-stage delay buffer circuit can output, as the IQ wave S(t), the carrier wave that is delayed by the delay buffer 31 in each of the first-stage delay section 32 and the second-stage delay section 32. In this way, the digital modulator 1 can modulate the phase of the carrier wave output by the carrier wave output section 2 to correspond to the digital value being transmitted.

Figure 7:
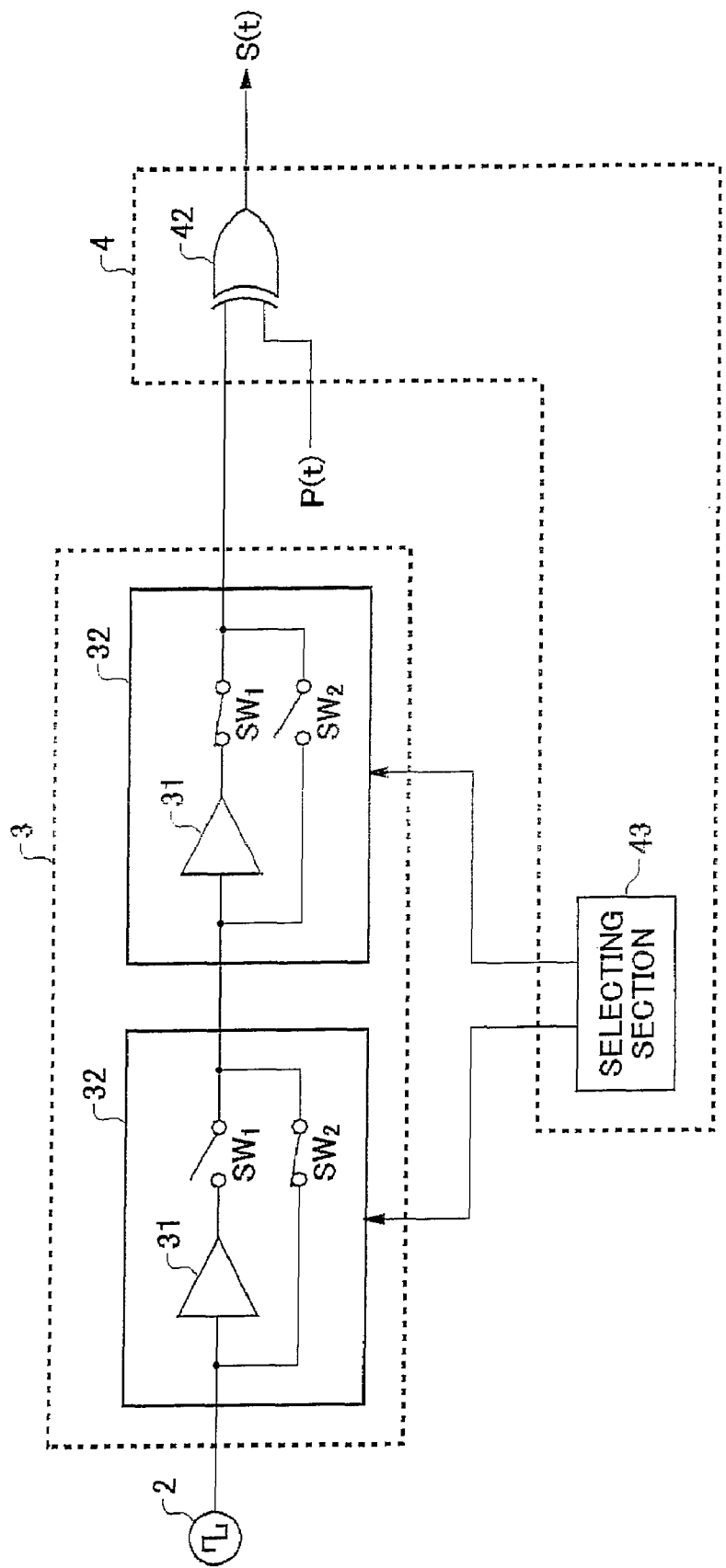
FIG. 7 shows another exemplary digital circuit describing a detailed configuration of the digital modulator 1.

FIG. 7 shows another exemplary digital circuit describing a detailed configuration of the digital modulator 1. FIG. 7 represents a digital circuit that is an M-PSK modulator, where M=8. Configurations in FIG. 7 that are identical to those of FIG. 4 or 6 are given the same reference numerals, and only differing points will be described.

In FIG. 7, the delay amount of the delay buffer 31 in each delay section 32 is different for each delay section 32. The number of stages of delay sections 32 in the cascade connection is set to L−1. The delay amount of the delay buffer 31 in the first-stage delay section 32 is equal to $T/2^2$, the delay amount of the delay buffer 31 in the second-stage delay section 32 is equal to $T/2^3$, ..., and the delay amount of the delay buffer 31 in the (L−1)-stage delay section 32 is equal $T/2^L$.

Since there are two stages of delay sections 32 in FIG. 7, the delay amount of the delay buffer 31 in the first-stage delay section 32 is equal to $T/2^2$, which is T/4, and the delay amount of the delay buffer 31 in the second-stage delay section 32 is equal to $T/2^3$, which is T/8.

The delay amount setting section 4 shown in FIG. 6 includes the exclusive OR gate 42 in addition to the selecting section 43. The selecting section 43 sets the delay amount of the phase of the carrier wave output from the multi-stage delay buffer circuit by connecting or disconnecting the switches SW1 and SW2 in each delay section 32 according to a value obtained by removing one digit from the digital signal being transmitted. Here, each phase delayed by the multi-stage delay buffer circuit is associated in advance with a value obtained by removing one digit from the digital value. The multi-stage delay buffer circuit outputs the carrier wave to the exclusive OR gate 42.

As described above, P(t) is equal to one bit of the digital value being transmitted. Depending on the input P(t), the exclusive OR gate 42 either (i) outputs the input carrier wave without alteration as the IQ wave S(t) or (ii) inverts the input carrier wave, which is equivalent to delaying the phase of the input carrier wave by π, and outputs the thus inverted carrier wave as the IQ wave S(t). Here, if the input P(t) is equal to 0, the exclusive OR gate 42 outputs the input carrier wave as the IQ wave S(t). If the input P(t) is equal to 1, the exclusive OR gate 42 outputs the inverted input carrier wave as the IQ wave S(t).

If the phase 0 is set to correspond to the digital value 00 and the digital value being transmitted is 000 or 100, the digital value from which the first digit is removed is equal to 00. Accordingly, the phase is to be delayed by 0, and therefore the selecting section 43 turns off the switch SW1 and turns on the switch SW2 in each of the first-stage delay section 32 and the second-stage delay section 32. In this way, the multi-stage delay buffer circuit outputs the carrier wave having a phase that is not delayed, as shown by (I) of FIG. 5. If the digital value being transmitted is 001, P(t) is equal to 0, and therefore the exclusive OR gate 42 outputs the carrier wave (1) as the IQ wave S(t). If the digital value being transmitted is 100, P(t) is equal to 1, and therefore the exclusive OR gate 42 inverts the carrier wave (1) to obtain the carrier wave (5), as shown in FIG. 5, and outputs this carrier wave (5) as the IQ wave S(t).

If the phase T/8 is set to correspond to the digital value 01 and the digital value being transmitted is 001 or 101, the digital value from which the first digit is removed is equal to 01. Accordingly, the phase is to be delayed by T/8, and therefore the selecting section 43 turns off the switch SW1 and turns on the switch SW2 in the first-stage delay section 32. The selecting section 43 also turns on the switch SW1 and turns off the switch SW2 in the second-stage delay section 32. In this way, the multi-stage delay buffer circuit outputs the carrier wave having a phase that is delayed by T/8, as shown by (2) of FIG. 5.

If the digital value being transmitted is 001, P(t) is equal to 0, and therefore the exclusive OR gate 42 outputs the carrier wave (2) as the IQ wave S(t). If the digital value being transmitted is 101, P(t) is equal to 1, and therefore the exclusive OR gate 42 inverts the carrier wave (2) to obtain the carrier wave (6), as shown in FIG. 5, and outputs this carrier wave (6) as the IQ wave S(t).

If the phase 2T/8 is set to correspond to the digital value 10 and the digital value being transmitted is 010 or 110, the digital value from which the first digit is removed is equal to 10. Accordingly, the phase is to be delayed by 2T/8, and therefore the selecting section 43 turns on the switch SW1 and turns off the switch SW2 in the first-stage delay section 32. The selecting section 43 also turns off the switch SW1 and turns on the switch SW2 in the second-stage delay section 32. In this way, the multi-stage delay buffer circuit outputs the carrier wave having a phase that is delayed by 2T/8, as shown by (3) of FIG. 5.

If the digital value being transmitted is 010, P(t) is equal to 0, and therefore the exclusive OR gate 42 outputs the carrier wave (3) as the IQ wave S(t). If the digital value being transmitted is 110, P(t) is equal to 1, and therefore the exclusive OR gate 42 inverts the carrier wave (3) to obtain the carrier wave (7), as shown in FIG. 5, and outputs this carrier wave (7) as the IQ wave S(t).

If the phase 3T/8 is set to correspond to the digital value 11 and the digital value being transmitted is 011 or 111, the digital value from which the first digit is removed is equal to 11. Accordingly, the phase is to be delayed by 3T/8, and therefore the selecting section 43 turns on the switch SW1 and turns off the switch SW2 in each of the first-stage delay section 32 and the second-stage delay section 32. In this way, the multi-stage delay buffer circuit outputs the carrier wave having a phase that is delayed by 3T/8, as shown by (4) of FIG. 5.

If the digital value being transmitted is 011, P(t) is equal to 0, and therefore the exclusive OR gate 42 outputs the carrier wave (4) as the IQ wave S(t). If the digital value being transmitted is 111, P(t) is equal to 1, and therefore the exclusive OR gate 42 inverts the carrier wave (4) to obtain the carrier wave (8), as shown in FIG. 5, and outputs this carrier wave (8) as the IQ wave S(t). In this way, the digital modulator 1 can modulate the phase of the carrier wave output by the carrier wave output section 2 to correspond to the digital value being transmitted.

Figure 8:
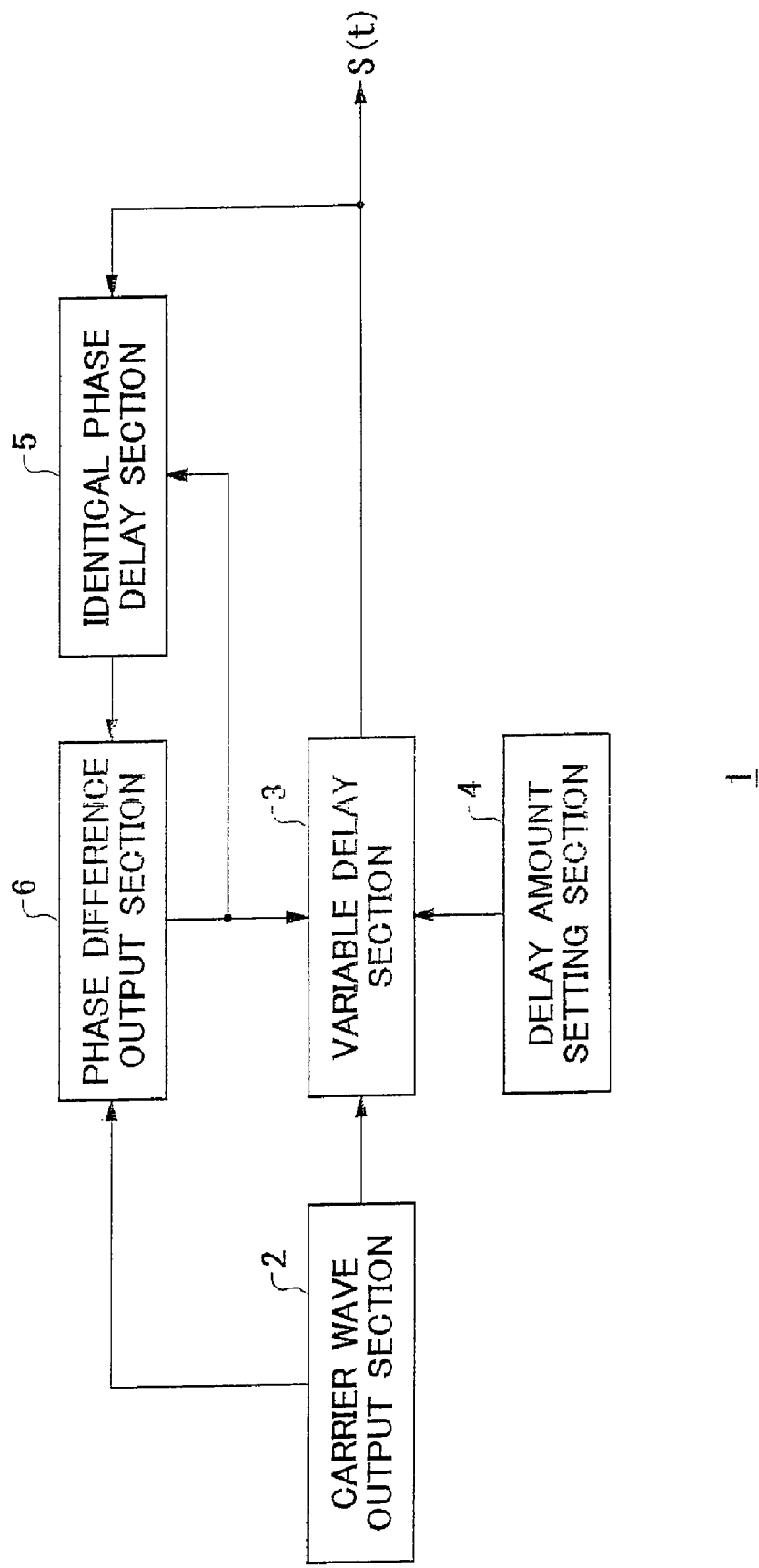
FIG. 8 shows another exemplary configuration of the digital modulator 1 according to the present embodiment.

FIG. 8 shows another exemplary configuration of the digital modulator 1 according to the present embodiment. Configurations in FIG. 8 that are the same as those in FIG. 1 are given the same reference numerals, and only differing points will be described. The digital modulator 1 shown in FIG. 8 is an example of the digital modulator 1 of FIG. 1 with a delay lock loop circuit added thereto. The digital modulator 1 of FIG. 8 is provided with an identical phase delay section 5 and a phase difference output section 6 in addition to the carrier wave output section 2, the variable delay section 3, and the delay amount setting section 4.

The identical phase delay section 5 delays the carrier waves having a phase delayed by the variable delay section 3, such that this carrier wave has a phase identical to the phase of the carrier wave output from the carrier wave output section 2. The identical phase delay section 5 outputs the thus delayed wave to the phase difference output section 6. The identical phase delay section 5 may include a delay buffer 31.

The phase difference output section 6 receives the carrier wave output from the carrier wave output section 2 and the delayed wave output from the identical phase delay section 5. The phase difference output section 6 detects a voltage based on the phase difference between the carrier wave and the delayed wave. The phase difference output section 6 outputs this voltage to the variable delay section 3 and the identical phase delay section 5 to reset the variable delay section 3 and the identical phase delay section 5 to an initial state. In other words, the phase difference output section 6 resets the variable delay section 3 and the identical phase delay section 5 to eliminate any difference between the phases of the carrier wave output from the carrier wave output section 2 and the delayed wave output from the identical phase delay section 5.

The phase difference output section 6 is provided with a charge pump and a loop filter in a cathode connection. The phase difference output section 6 outputs the detected voltage to the charge plump. The voltage output from the loop filter may be supplied to the variable delay section 3 and the identical phase delay section 5.

If the carrier wave output section 2, the variable delay section 3, and the delay amount setting section 4 of the digital modulator 1 shown in FIG. 8 have the same configuration as the carrier wave output section 2, the variable delay section 3, and the delay amount setting section 4 shown in FIGS. 2 and 3, the carrier wave that is delayed by all of the delay buffers 31 in the variable delay section 3 may be input into the identical phase delay section 5, and the IQ wave S(t) may also be input into the identical phase delay section 5.

The phase difference output section 6 outputs the detected voltage to each delay buffer 31 in the variable delay section 3 and each delay buffer 31 in the identical phase delay section 5, thereby resetting the delay buffers 31. In this way, the phase difference output section 6 can accurately adjust the delay amounts of the delay buffers 31.

If the carrier wave output section 2, the variable delay section 3, and the delay amount setting section 4 of the digital modulator 1 shown in FIG. 8 have the same configuration as the carrier wave output section 2, the variable delay section 3, and the delay amount setting section 4 shown in FIGS. 6 and 7, the carrier wave delayed by the variable delay section 3 when each delay section 32 in the variable delay section 3 has switch SW1 turned on and switch SW2 turned off may be output to the identical phase delay section 5. The IQ wave S(t) may be input to the identical phase delay section 5.

The phase difference output section 6 outputs the detected voltage to the delay section 32 in each delay buffer 31 in the variable delay section 3 and to each delay buffer 31 in the identical phase delay section 5, thereby resetting the delay buffers 31. In this way, the phase difference output section 6 can accurately adjust the delay amounts of the delay buffers 31.

Figure 9:
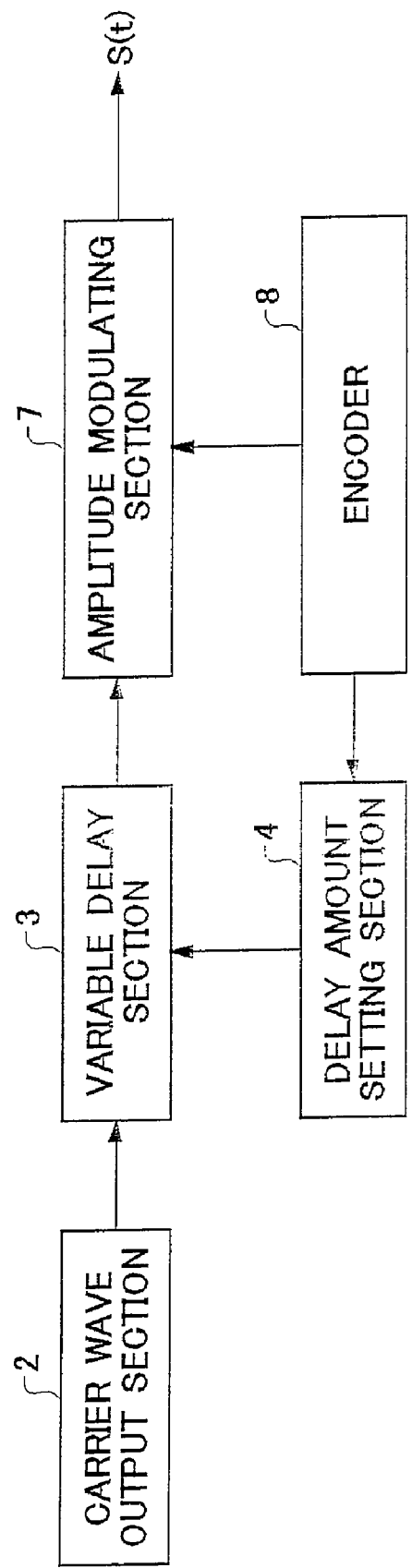
FIG. 9 shows another exemplary configuration of the digital modulator 1 according to the present embodiment.

FIG. 9 shows another exemplary configuration of the digital modulator 1 according to the present embodiment. Configurations in FIG. 9 that are the same as those in FIG. 1 are given the same reference numerals, and only differing points will be described. The digital modulator 1 shown in FIG. 9 is provided with an amplitude modulating section 7 and an encoder 8 in addition to the carrier wave output section 2, the variable delay section 3, and the delay amount setting section 4.

The encoder 8 encodes the digital value being transmitted with delay control data or amplitude control data for controlling the phase and amplitude to correspond to the digital value being transmitted. The delay control data controls the delay amount set by the delay amount setting section 4. The amplitude control data controls the amplitude of the modulation by the amplitude modulating section 7.

The amplitude modulating section 7 changes the amplitude of the carrier wave output from the variable delay section 3. The amplitude modulating section 7 may be an amplifier. The amplitude modulating section 7 modulates the amplitude of the input carrier wave based on the delay control data encoded by the encoder 8. The delay amount setting section 4 sets the delay amount of the variable delay section 3 based on the delay control data encoded by the encoder 8.

Figure 10:
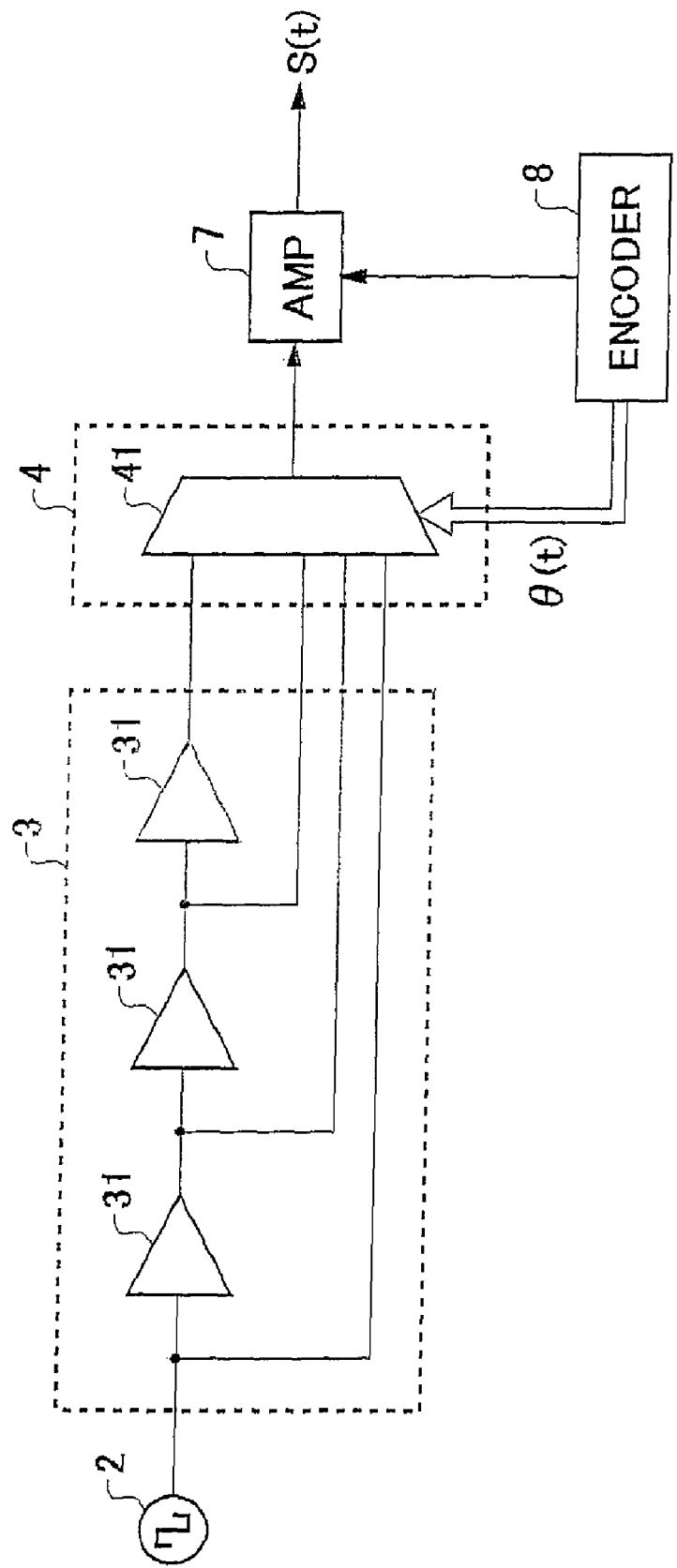
FIG. 10 shows another exemplary digital circuit describing a detailed configuration of the digital modulator 1.

FIG. 10 shows another exemplary digital circuit describing a detailed configuration of the digital modulator 1 of FIG. 9. FIG. 10 represents a digital circuit that is an M-APSK modulator, where M=8. Configurations in FIG. 10 that are identical to those of FIG. 2 are given the same reference numerals, and only differing points will be described.

The amplifier 7, which is the amplitude modulating section, modulates the amplitude of the carrier wave output from the multiplexer 41, and outputs the thus modulated carrier wave as the IQ wave S(t). Here, the amplifier 7 multiplies the amplitude by a factor of 1 or 2.

The encoder 8 encodes the digital data being transmitted with the delay control data, represented by θ(t), and the amplitude control data, such that delay amount and the amplitude correspond to the digital value being transmitted. The encoder 8 then outputs the delay control data to the multiplexer 41 and outputs the amplitude modulation data to the amplifier 7.

Figure 11:
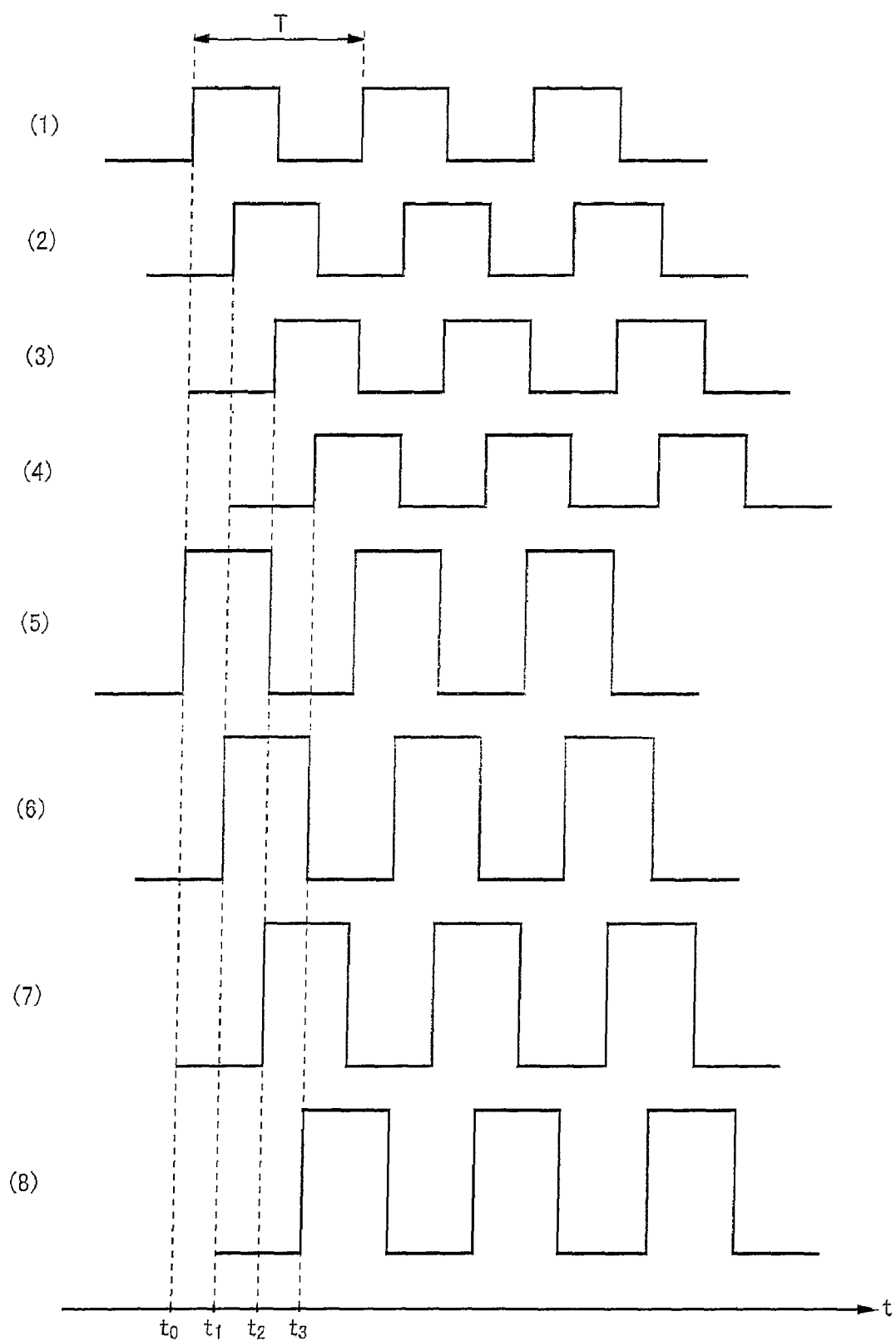
FIG. 11 shows carrier waves output as the IQ wave S(t).

FIG. 11 shows carrier waves output as the IQ wave S(t) from the digital circuit shown in FIG. 10. In FIG. 11, the phase of the carrier wave (2) is delayed by $t_1-t_0$, which is equal to T/4, in relation to the phase of the carrier wave (1). The phase of the carrier wave (3) is delayed by $t_2-t_0$, which is equal to 2T/4, in relation to the phase of the carrier wave (1). The phase of the carrier wave (4) is delayed by $t_3-t_0$, which is equal to 3T/4, in relation to the phase of the carrier wave (1).

FIG. 11 further shows that the carrier wave (5) of FIG. 5 has the same phase as the carrier wave (1) in FIG. 11, but has different amplitude. Specifically, the carrier wave (1) in FIG. 11 has double the amplitude of the carrier wave (5) of FIG. 5.

The carrier wave (6) of FIG. 5 has the same phase as the carrier wave (2) in FIG. 11, but has different amplitude. Specifically, the carrier wave (2) in FIG. 11 has double the amplitude of the carrier wave (6) of FIG. 5.

Furthermore, the carrier wave (7) of FIG. 5 has the same phase as the carrier wave (3) in FIG. 11, but has different amplitude. Specifically, the carrier wave (3) in FIG. 11 has double the amplitude of the carrier wave (7) of FIG. 5. The carrier wave (8) of FIG. 5 has the same phase as the carrier wave (4) in FIG. 11, but has different amplitude. Specifically, the carrier wave (4) in FIG. 11 has double the amplitude of the carrier wave (8) of FIG. 5.

In this way, the digital circuit shown in FIG. 10 can generate eight carrier waves, thereby allowing the digital circuit to modulate a 3-bit digital signal. Specifically, the digital values 000, 001, 010, 011, 100, 101, 110, and 111 can be respectively associated with eight carrier waves having different phases and amplitudes. Therefore, the digital modulator 1 can modulate the phase and amplitude of the carrier wave output by the carrier wave output section 2 to correspond to the digital data being transmitted.

The variable delay section 3 and the delay amount setting section 4 of the digital modulator 1 are not limited to the digital circuit shown in FIG. 10, and may also be any one of the digital circuits shown in FIGS. 4, 6, and 7.

Figure 12:
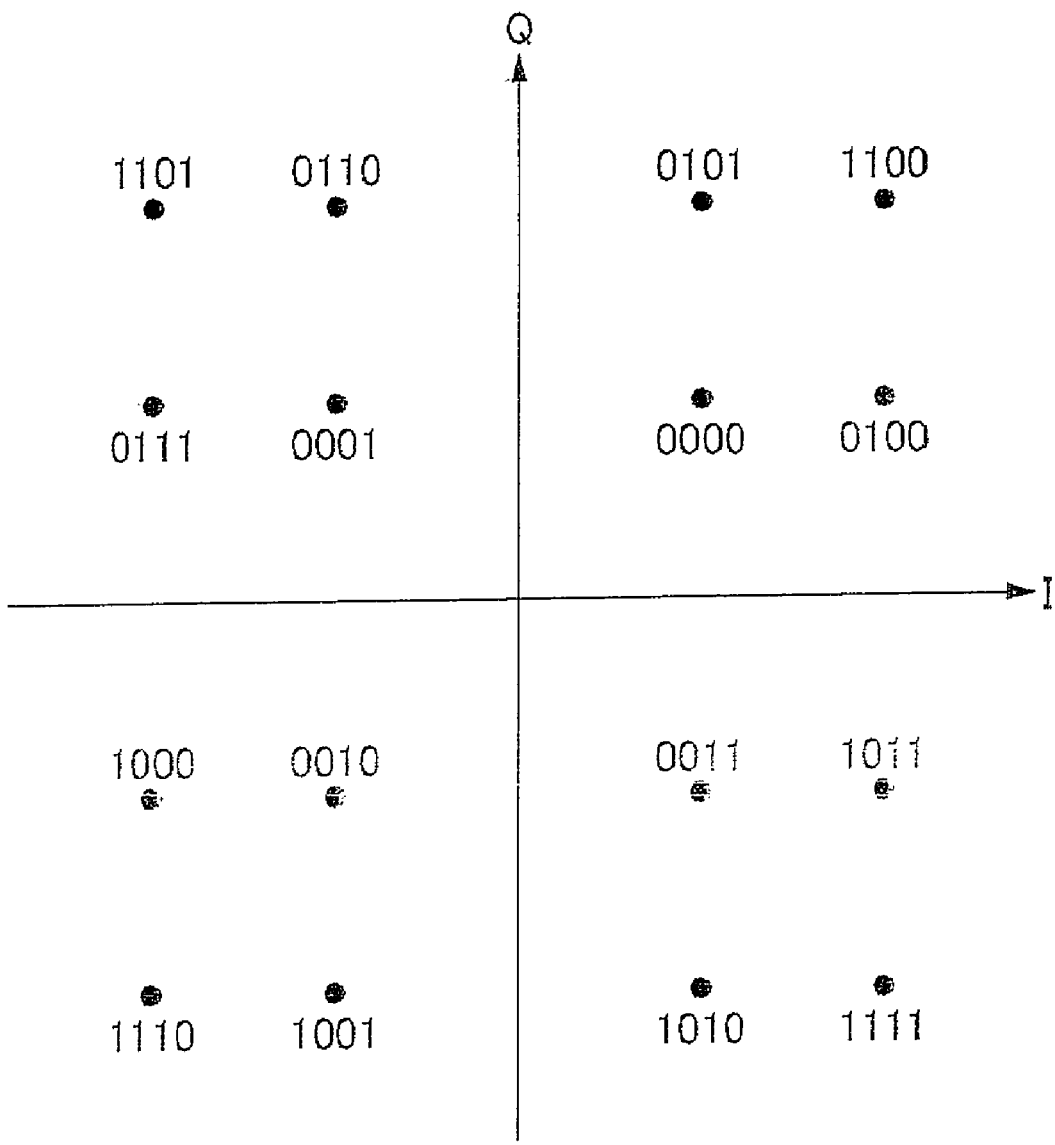
FIG. 12 shows a signal space diagram of an M-QAM in which the digitally modulated data signal points are expressed on the IQ plane.

A QAM modulator, which is a type of PSK modulator, may be used to modulate the amplitude and the phase to correspond to the digital values being transmitted. FIG. 12 shows a signal space diagram of an M-QAM, where M is 16, in which the digitally modulated data signal points are expressed on the IQ plane. The signal points plotted on the diagram in FIG. 12 each correspond to a digital value. The digital modulator 1 may modulate the phase and the amplitude of the carrier wave to correspond to the phase and amplitude of the signal points associated with the digital values.

For example, if the amplitude of a circle passing through the signal points corresponding to the digital values 0000, 0001, 0010, and 0111 is the same as the amplitude of carrier wave output from the carrier wave output section 2 and the digital value being transmitted is 0001, the phase of the carrier wave output from the carrier wave output section 2 should be delayed by 3π/4 and the amplitude should be unchanged. If the amplitude of a circle passing through the signal points corresponding to the digital values 1100, 1101, 1110, and 1111 is double the amplitude of carrier wave output from the carrier wave output section 2 and the digital value being transmitted is 1111, the phase of the carrier wave output from the carrier wave output section 2 should be delayed by 7π/4 and the phase should be doubled.

Figure 13:
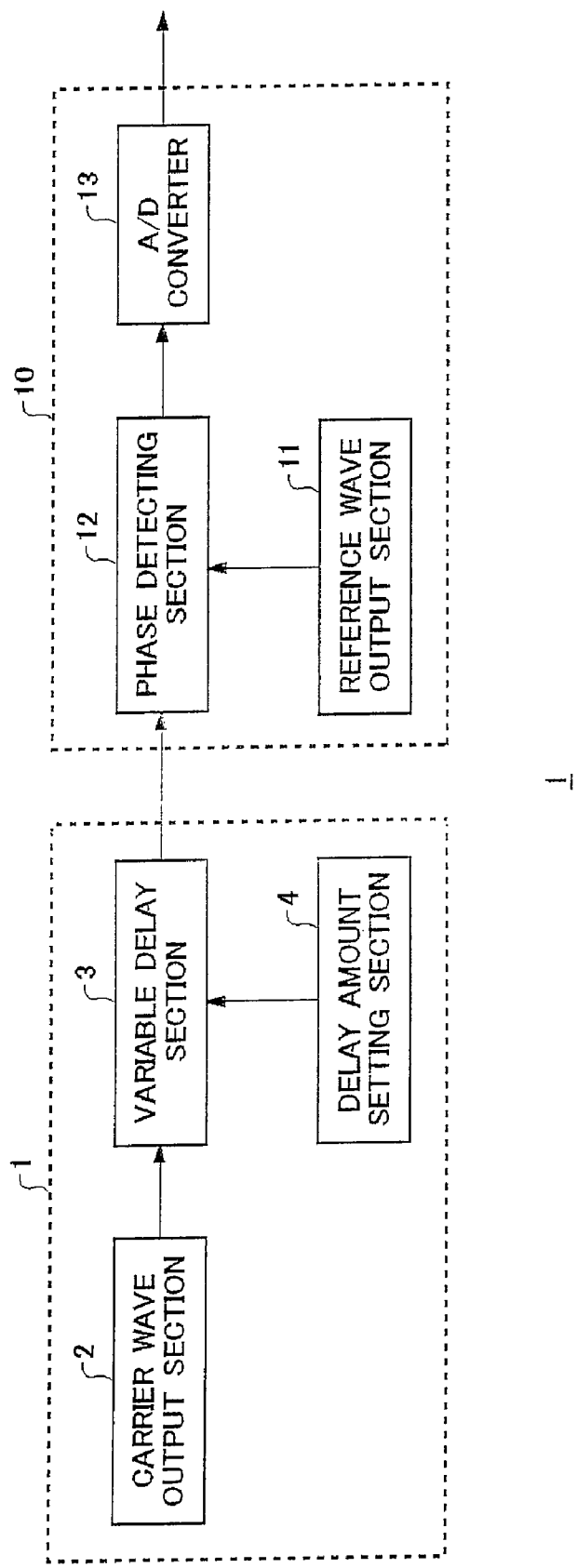
FIG. 13 shows an exemplary configuration of a digital transceiver system according to the present embodiment.

FIG. 13 shows an exemplary configuration of a digital transceiver system according to the present embodiment. Configurations in FIG. 13 that are identical to those of FIG. 1 are given the same reference numerals, and only differing points will be described.

The transceiver system of FIG. 13 is provided with the digital modulator 1 and a demodulator 10. The digital modulator 1 has the same configuration as shown in FIG. 1, and is given the same reference numerals. The digital modulator 1 of FIG. 13 may also be the digital modulator 1 shown in FIG. 8, or the digital modulator 1 shown in FIG. 9. The demodulator 10 is provided with a reference wave output section 11, a phase detecting section 12, and an A/D converter 13.

The reference wave output section 11 outputs a reference wave. The reference wave output section 11 may be an oscillator that outputs a clock signal. The reference wave output section 11 outputs the reference wave to the phase detecting section 12. Here, the reference wave output section 11 outputs a wave having a waveform identical to that of the carrier wave output from the carrier wave output section 2 of the digital modulator 1. An "identical waveform" refers to a waveform that has the same phase and amplitude.

The phase detecting section 12 detects the amplitude difference and the phase difference between the reference wave and the IQ wave S(t) sent from the digital modulator 1. The phase detecting section 12 outputs a voltage according to the detected amplitude difference and phase difference to the A/D converter 13.

The A/D converter 13 converts the received voltage into a digital signal. Here, the A/D converter 13 performs the digital conversion based on the phase and the amplitude allocated to each digital value by the digital modulator 1.

For example, if the phase $2\pi/2$ is associated with the digital value 10 and the phase difference detected by the phase detecting section 12 is $2\pi/2$, the A/D converter 13 converts the carrier wave into the digital value 10 based on the voltage corresponding to the detected phase difference. In this way, the digital modulator 1 can demodulate the digitally modulated carrier wave to be a digital value.

In the digital modulator 1 described above, the phase of the carrier wave desirably changes every several pulses, such as every 10 or 20 pulses, rather than changing for every single pulse. By doing this, it is easy to read the phase of the digitally modulated carrier wave in the demodulator. A band pass filter may be provided at the output of the digital modulator 1 described above. The band pass filter can cut the harmonic components of the IQ wave S(t). Especially if the output carrier wave has a different frequency at a plurality of channels, there is a problem that frequencies overlap at different channels, but the band pass filter can decrease the overlapping area.

Figure 14:
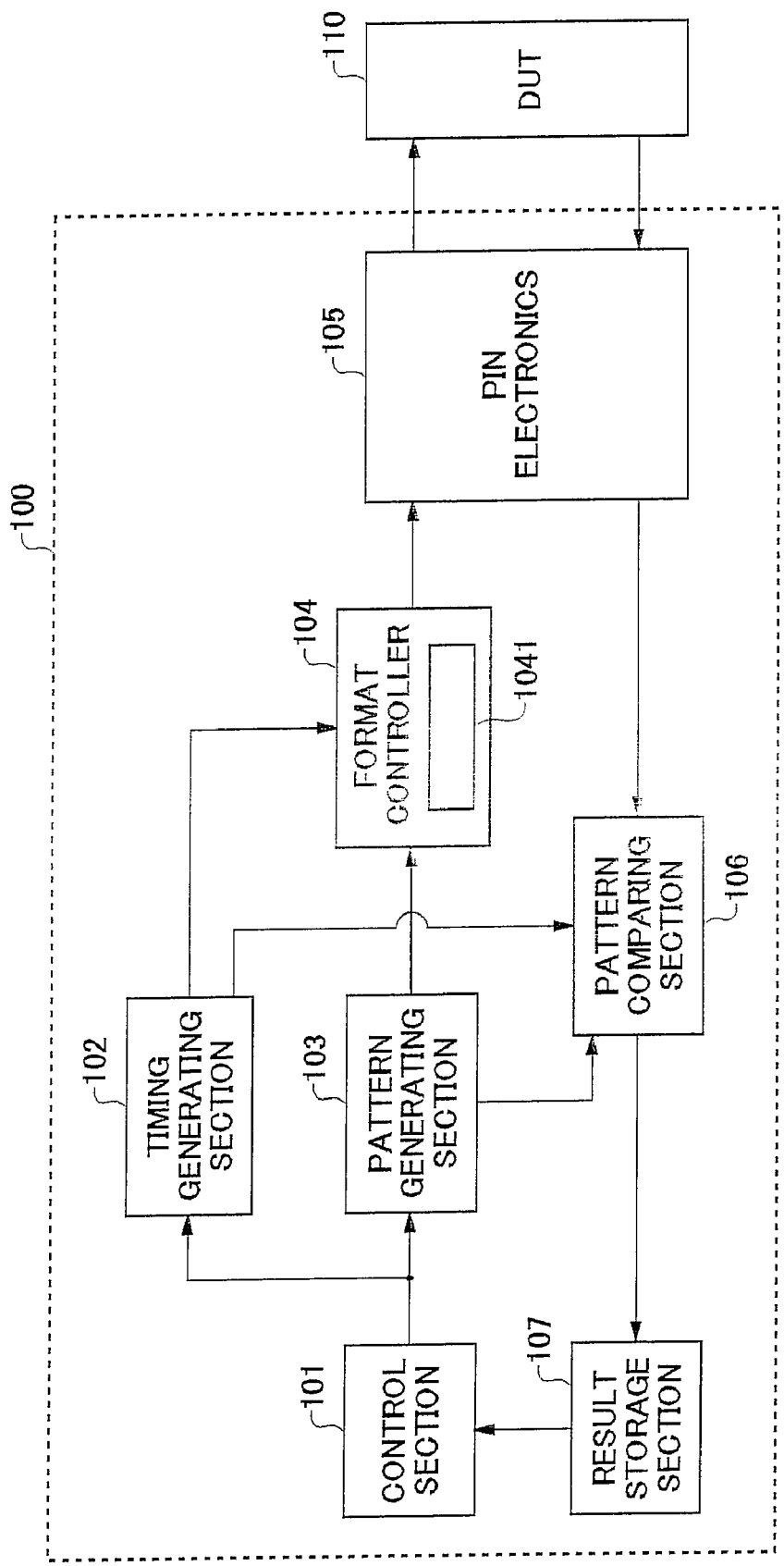
FIG. 14 shows an exemplary configuration of a test apparatus 100 according to the present embodiment.

FIG. 14 shows an exemplary configuration of a test apparatus 100 according to the present embodiment. The test apparatus 100 is provided with a control section 101, a timing generating section 102, a pattern generating section 103, a format controller 104, a pin electronics 105, a pattern comparing section 106, and a result storage section 107. A DUT 110 represents a device under test.

The timing generating section 102 is controlled by the control section 101 to generate a clock pulse for determining the timing of the rising edges and the falling edges of a test signal. The timing generating section 102 outputs the generated clock pulse to the format controller 104. The timing generating section 102 outputs a strobe signal to the pattern comparing section 106.

The pattern generating section 103 is controlled by the control section 101 to generate a pattern signal that serves as the base for the prescribed test signal being supplied to the DUT 110, and to output this pattern signal to the format controller. The pattern generating section 103 outputs an expected value of the test signal for measuring the DUT 110 to the pattern comparing section 106.

The format controller 104 shapes the pattern signal output from the pattern generating section 103 into the test signal having the prescribed waveform based on the edges of the clock pulse output from the timing generating section 102. The format controller 104 is provided with a variable phase section 1041. The variable phase section 1041 delays the test signal based on the timing signal generated by the timing generating section 102. The variable phase section 1041 outputs the delayed test signal to the pin electronics 105.

The pin electronics 105 inputs the waveform shaped by the format controller 104 into the DUT 110. The pin electronics 105 detects the signal waveform output by the DUT 110 in response to the input waveform.

The pattern comparing section 106 compares the expected value to the signal waveform detected by the pin electronics 105. The pattern comparing section 106 performs this comparison based on the timing of the strobe signal. The result storage section 107 stores therein the comparison result of the pattern comparing section 106.

The test apparatus 100 may function as the digital modulator 1. For example, the timing generating section 102, the pattern generating section 103, and the format controller 104 may function as the carrier wave output section 2 of the digital modulator 1 to shape of the test signal. The variable phase difference section 1041 may be used as the variable delay section 3 of the digital modulator 1. The format controller 104 may function as the delay amount setting section. The test signal delayed by this digital modulator 1 is output to the DUT 110.

The variable delay section 3 and the delay amount setting section 4 may be provided at the output end of the format controller 104 to cause the timing generating section 102, the pattern generating section 103, and the format controller to function as the carrier wave output section 2. The test signal delayed by this digital modulator 1 is output to the DUT 110.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

As made clear from the above, by using the embodiments of the present invention, a digital modulator can be realized that performs digital modulation with reduced implementation area and power consumption, since the digital modulator is configured as a digital circuit.

What is claimed is:
1. A digital modulator, comprising:
a carrier wave output section that outputs a carrier wave;
a variable delay section that delays the carrier wave; and
a delay amount setting section that sets a delay amount by which the variable delay section delays the carrier wave based on transmission data being transmitted by the carrier wave, the delay amount setting section including an exclusive OR gate that receives two inputs, one input being a value of a 1-bit portion of N-bit transmission data for setting the delay amount, and the other input being an output of the carrier wave output section or the variable delay section.
2. The digital modulator according to claim 1, wherein
the variable delay section includes a multi-stage delay buffer circuit in which delay buffers that delay an input signal by a unit shift amount are connected in a cascade connection,
the multi-stage delay buffer circuit receives the carrier wave at a first-stage delay buffer as input,
the delay amount setting section includes a multiplexer that selects either an output from the carrier wave output section or an output from each stage of the multi-stage delay buffer circuit, based on the transmission data, and
said other input of the exclusive OR gate is the output of the multiplexer.
3. The digital modulator according to claim 2, wherein
the multi-stage delay buffer circuit includes M−1 stages of delay buffers in the cascade connection, and
each delay buffer delays the input signal by an amount obtained by dividing a cycle of the carrier wave by M.

4. The digital modulator according to claim 2, wherein
the multiplexer selects the output according to a value of N−1 bits obtained by removing the 1-bit portion from the N-bit transmission data.

5. The digital modulator according to claim 4, wherein,
the multi-stage delay buffer circuit includes $2^{N-1}-1$ stages of delay buffers in the cascade connection, and
each delay buffer delays the input signal by an amount obtained by dividing a cycle of the carrier wave by $2^N$.

6. The digital modulator according to claim 1, further comprising an amplitude modulating section that modulates amplitude of the carrier wave delayed by the variable delay section according to the transmission data.

7. The digital modulator according to claim 6, further comprising an encoder that encodes the transmission data with delay control data for controlling the delay amount set by the delay amount setting section and amplitude control data for controlling the amplitude modulated by the amplitude modulating section, wherein
the delay amount setting section sets the delay amount of the carrier wave based on the delay control data encoded by the encoder, and
the amplitude modulating section modulates the amplitude of the carrier wave based on the amplitude control data encoded by the encoder.

8. The digital modulator according to claim 1, wherein
the variable delay section includes a multi-stage delay buffer circuit including a plurality of delay sections connected in a cascade connection,
each delay section includes a delay buffer that delays an input signal by any amount that is less than or equal to a cycle of the carrier wave and a bypass circuit that bypasses the delay buffer,
the multi-stage delay buffer circuit receives the carrier wave at a first-stage delay section as input, and
the delay amount setting section sets a delay amount of the carrier wave by selecting either the delay buffer or the bypass circuit in each delay section, based on the transmission data being transmitted.

9. The digital modulator according to claim 8, wherein
the multi-stage delay buffer circuit includes L−1 stages of delay sections in the cascade connection,
the delay buffers in the delay sections at the L−1 stages delay the input signal by a period obtained by dividing the cycle of the carrier wave by $2^2, 2^3, \ldots 2^L$, respectively,
said other input of the exclusive OR gate is an output of the multi-stage delay buffer circuit, and
the delay amount setting section sets the delay amount of the carrier wave by selecting either the delay buffer or the bypass circuit in each delay section, based on a value of N−1 bits obtained by removing the 1-bit portion from the N-bit transmission data.

10. The digital modulator according to claim 1, further comprising:
a delay lock loop that includes a phase difference output section that receives the carrier wave output by the carrier wave output section and a delayed wave having the same phase as the carrier wave via the variable delay section, and outputs a voltage according to a phase difference between the carrier wave and the delayed wave, wherein
the delay lock loop supplies the voltage output by the phase difference output section to the delay buffers in the variable delay section to reset the delay amount of the carrier wave delayed by the variable delay section.

11. A digital modulator, comprising:
a carrier wave output section that outputs a carrier wave;
a variable delay section that delays the carrier wave; and
a delay amount setting section that sets a delay amount by which the variable delay section delays the carrier wave based on transmission data being transmitted by the carrier wave, wherein
the variable delay section includes a multi-stage delay buffer circuit including a plurality of delay sections connected in a cascade connection,
each delay section includes a delay buffer that delays an input signal by any amount that is less than or equal to a cycle of the carrier wave and a bypass circuit that bypasses the delay buffer,
the multi-stage delay buffer circuit receives the carrier wave at a first-stage delay section as input, and
the delay amount setting section sets a delay amount of the carrier wave by selecting either the delay buffer or the bypass circuit in each delay section, based on the transmission data being transmitted.

12. The digital modulator according to claim 11, wherein
the multi-stage delay buffer circuit includes L stages of delay sections in the cascade connection, and
the delay buffers in the delay sections at the L stages delay the input signal by a period obtained by dividing the cycle of the carrier wave by $2^1, 2^2, 2^3, \ldots, 2^L$, respectively.

13. A digital modulator, comprising:
a carrier wave output section that outputs a carrier wave;
a variable delay section that delays the carrier wave;
a delay amount setting section that sets a delay amount by which the variable delay section delays the carrier wave based on transmission data being transmitted by the carrier wave; and
a delay lock loop that includes a phase difference output section that receives the carrier wave output by the carrier wave output section and a delayed wave having the same phase as the carrier wave via the variable delay section, and outputs a voltage according to a phase difference between the carrier wave and the delayed wave, wherein
the delay lock loop supplies the voltage output by the phase difference output section to the delay buffers in the variable delay section to reset the delay amount of the carrier wave delayed by the variable delay section.

14. A digital modulator, comprising:
a carrier wave output section that outputs a carrier wave;
a variable delay section that delays the carrier wave;
a delay amount setting section that sets a delay amount by which the variable delay section delays the carrier wave based on transmission data being transmitted by the carrier wave;
an amplitude modulating section that modulates amplitude of the carrier wave delayed by the variable delay section according to the transmission data; and
an encoder that encodes the transmission data with delay control data for controlling the delay amount set by the delay amount setting section and amplitude control data for controlling the amplitude modulated by the amplitude modulating section, wherein
the delay amount setting section sets the delay amount of the carrier wave based on the delay control data encoded by the encoder, and
the amplitude modulating section modulates the amplitude of the carrier wave based on the amplitude control data encoded by the encoder.

15. A digital modulation method, comprising the steps of:
outputting a carrier wave;
delaying the carrier wave;
setting an amount by which the carrier wave is delayed at the delaying step based on transmission data being transmitted by the carrier wave;
receiving, by an exclusive OR gate, two inputs, one input being a value of a 1-bit portion of N-bit transmission data for setting the delay amount, and the other input being the carrier wave or the delayed carrier wave.

16. A digital transceiver system, comprising:
a digital modulator that includes:
    a carrier wave output section that outputs a carrier wave;
    a variable delay section that delays the carrier wave output by the carrier wave output section;
    a delay amount setting section that sets a delay amount by which the variable delay section delays the carrier wave based on transmission data being transmitted by the carrier wave, the delay amount setting section including an exclusive OR gate that receives two inputs, one input being a value of a 1-bit portion of N-bit transmission data for setting the delay amount, and the other input being an output of the carrier wave output section or the variable delay section; and
a demodulator that includes:
    a reference wave output section that outputs a reference wave identical to the carrier wave;
    a phase detecting section that outputs a voltage corresponding to a phase difference between the delayed carrier wave and the reference wave; and
    an analog-to-digital converter that converts the voltage output by the phase detecting section into the transmission data.

17. A test apparatus, comprising a digital modulator that includes:
a carrier wave output section that outputs a carrier wave;
a variable delay section that delays the carrier wave; and
a delay amount setting section that sets a delay amount by which the variable delay section delays the carrier wave based on transmission data being transmitted by the carrier wave, the delay amount setting section including an exclusive OR gate that receives two inputs, one input being a value of a 1-bit portion of N-bit transmission data for setting the delay amount, and the other input being an output of the carrier wave output section or the variable delay section, wherein
the test apparatus tests a device under test by supplying the device under test with a modulated signal output by the digital modulator.

18. The test apparatus according to claim 17, further comprising a variable phase section that modulates a timing of a test signal supplied to the device under test, wherein the variable delay section of the digital modulator uses the variable phase section.

19. A digital modulation method, comprising the steps of:
outputting a carrier wave;
delaying the carrier wave by a multi-stage delay buffer circuit including L stages of delay sections connected in a cascade connection, each of the delay sections including a delay buffer that delays an input signal and a bypass circuit that bypasses the delay buffer, the carrier wave being received at a first-stage delay section as input; and
setting an amount by which the carrier wave is delayed at the delaying step by selecting either the delay buffer or the bypass circuit in each delay section, based on transmission data being transmitted by the carrier wave, wherein
the delay buffers in the delay sections at the L stages delay the input signal by a period obtained by dividing the cycle of the carrier wave by $2^1, 2^2, 2^3, \ldots, 2^L$, respectively.

20. A digital transceiver system, comprising:
a digital modulator that includes:
    a carrier wave output section that outputs a carrier wave;
    a variable delay section that delays the carrier wave output by the carrier wave output section;
    a delay amount setting section that sets a delay amount by which the variable delay section delays the carrier wave based on transmission data being transmitted by the carrier wave; and
a demodulator that includes:
    a reference wave output section that outputs a reference wave identical to the carrier wave;
    a phase detecting section that outputs a voltage corresponding to a phase difference between the delayed carrier wave and the reference wave; and
    an analog-to-digital converter that converts the voltage output by the phase detecting section into the transmission data, wherein
the variable delay section includes a multi-stage delay buffer circuit including L stages of delay sections connected in a cascade connection,
each delay section includes a delay buffer that delays an input signal and a bypass circuit that bypasses the delay buffer,
the multi-stage delay buffer circuit receives the carrier wave at a first-stage delay section as input,
the delay amount setting section sets a delay amount of the carrier wave by selecting either the delay buffer or the bypass circuit in each delay section, based on the transmission data being transmitted, and
the delay buffers in the delay sections at the L stages delay the input signal by a period obtained by dividing the cycle of the carrier wave by $2^1, 2^2, 2^3, \ldots, 2^L$, respectively.

21. A test apparatus, comprising a digital modulator that includes:
a carrier wave output section that outputs a carrier wave;
a variable delay section that delays the carrier wave; and
a delay amount setting section that sets a delay amount by which the variable delay section delays the carrier wave based on transmission data being transmitted by the carrier wave, wherein
the variable delay section includes a multi-stage delay buffer circuit including L stages of delay sections connected in a cascade connection,
each delay section includes a delay buffer that delays an input signal and a bypass circuit that bypasses the delay buffer,
the multi-stage delay buffer circuit receives the carrier wave at a first-stage delay section as input,
the delay amount setting section sets a delay amount of the carrier wave by selecting either the delay buffer or the bypass circuit in each delay section, based on the transmission data being transmitted,
the delay buffers in the delay sections at the L stages delay the input signal by a period obtained by dividing the cycle of the carrier wave by $2^1, 2^2, 2^3, \ldots, 2^L$, respectively, and
the test apparatus tests a device under test by supplying the device under test with a modulated signal output by the digital modulator.

22. A digital modulation method, comprising the steps of:
outputting a carrier wave;
delaying the carrier wave;
setting an amount by which the carrier wave is delayed at the delaying step based on transmission data being transmitted by the carrier wave;
modulating amplitude of the delayed carrier wave according to the transmission data; and
encoding the transmission data with delay control data for controlling the amount by which the carrier wave is delayed at the delaying step and amplitude control data for controlling the amplitude modulated at the modulating step, wherein
the delay amount of the carrier wave is set based on the encoded delay control data, and
the amplitude of the carrier wave is modulated based on the encoded amplitude control data.

23. A digital transceiver system, comprising:
a digital modulator that includes:
   a carrier wave output section that outputs a carrier wave;
   a variable delay section that delays the carrier wave output by the carrier wave output section;
   a delay amount setting section that sets a delay amount by which the variable delay section delays the carrier wave based on transmission data being transmitted by the carrier wave;
   an amplitude modulating section that modulates amplitude of the carrier wave delayed by the variable delay section according to the transmission data;
   an encoder that encodes the transmission data with delay control data for controlling the delay amount set by the delay amount setting section and amplitude control data for controlling the amplitude modulated by the amplitude modulating section; and
a demodulator that includes:
   a reference wave output section that outputs a reference wave identical to the carrier wave;
   a phase detecting section that outputs a voltage corresponding to a phase difference between the delayed carrier wave and the reference wave; and
   an analog-to-digital converter that converts the voltage output by the phase detecting section into the transmission data, wherein
the delay amount setting section sets the delay amount of the carrier wave based on the delay control data encoded by the encoder, and
the amplitude modulating section modulates the amplitude of the carrier wave based on the amplitude control data encoded by the encoder.

24. A test apparatus, comprising a digital modulator that includes:
a carrier wave output section that outputs a carrier wave;
a variable delay section that delays the carrier wave;
a delay amount setting section that sets a delay amount by which the variable delay section delays the carrier wave based on transmission data being transmitted by the carrier wave;
an amplitude modulating section that modulates amplitude of the carrier wave delayed by the variable delay section according to the transmission data; and
an encoder that encodes the transmission data with delay control data for controlling the delay amount set by the delay amount setting section and amplitude control data for controlling the amplitude modulated by the amplitude modulating section, wherein
the delay amount setting section sets the delay amount of the carrier wave based on the delay control data encoded by the encoder,
the amplitude modulating section modulates the amplitude of the carrier wave based on the amplitude control data encoded by the encoder, and
the test apparatus tests a device under test by supplying the device under test with a modulated signal output by the digital modulator.

* * * * *